United States Patent
De Natale et al.

(10) Patent No.: US 10,262,811 B2
(45) Date of Patent: Apr. 16, 2019

(54) CONTROL SYSTEM FOR AN ELECTRICAL SWITCHING APPARATUS AND RELATED ELECTRICAL SWITCHING APPARATUS

(71) Applicant: ABB Schweiz AG, Baden (CH)

(72) Inventors: Gabriele Valentino De Natale, Milan (IT); Fabio Mannino, Curno (IT); Andrea Ricci, Dalmine (IT); Andrea Crespi, Gallarate (IT)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/547,725

(22) PCT Filed: Jan. 8, 2016

(86) PCT No.: PCT/EP2016/050291
§ 371 (c)(1),
(2) Date: Jul. 31, 2017

(87) PCT Pub. No.: WO2016/120041
PCT Pub. Date: Aug. 4, 2016

(65) Prior Publication Data
US 2018/0033567 A1 Feb. 1, 2018

(30) Foreign Application Priority Data
Jan. 30, 2015 (EP) .................... 15153371

(51) Int. Cl.
*G08B 21/00* (2006.01)
*H01H 9/16* (2006.01)
(Continued)

(52) U.S. Cl.
CPC .............. *H01H 9/16* (2013.01); *H01H 9/167* (2013.01); *H02H 3/044* (2013.01);
(Continued)

(58) Field of Classification Search
CPC .... H01H 9/16; H01H 2071/044; H02H 3/044; H03K 17/18
(Continued)

(56) References Cited

U.S. PATENT DOCUMENTS

2005/0057870 A1 3/2005 Stellato et al.
2011/0255202 A1 10/2011 Hartmann
(Continued)

FOREIGN PATENT DOCUMENTS

| CN | 102246374 A | 11/2011 |
|---|---|---|
| EP | 2819259 A1 | 12/2014 |
| WO | 2011121386 A1 | 10/2011 |

OTHER PUBLICATIONS

European Search Report, EP15153371, ABB Technology AG, Jul. 16, 2015, 5 pages.
(Continued)

*Primary Examiner* — Tanmay K Shah
(74) *Attorney, Agent, or Firm* — J. Bruce Schelkopf; Taft Stettinius & Hollister LLP

(57) ABSTRACT

A control system for an electrical switching apparatus adapted to be installed in a medium voltage or high voltage electrical circuit. The control system includes at least a first module with first control means which are adapted to execute a first control logic, and a second module with second control means which are adapted to execute a second control logic; and at least one communication bus. The first control means and the second control means are adapted to be operatively connected to the at least one communication bus, and to share values of variables associated to the first control logic and to the second control logic through the at least one communication bus.

20 Claims, 4 Drawing Sheets

(51) Int. Cl.
*H02H 3/04* (2006.01)
*H01H 71/00* (2006.01)
*H01H 71/04* (2006.01)
*H03K 17/18* (2006.01)

(52) U.S. Cl.
CPC . *H01H 2071/006* (2013.01); *H01H 2071/044* (2013.01); *H03K 17/18* (2013.01)

(58) Field of Classification Search
USPC .......................................................... 340/644
See application file for complete search history.

(56) References Cited

U.S. PATENT DOCUMENTS

2014/0355159 A1* 12/2014 Maehara .............. H02H 1/0007
361/78
2016/0254686 A1* 9/2016 Steil ...................... B60L 3/0046
320/112

OTHER PUBLICATIONS

International Search Report and Written Opinion, PCT/EP2016/050291, ABB Technology AG, 9 pages.
Chinese Office Action dated Sep. 3, 2018; Chinese Application No. 201680008145.3; Applicant: ABB Schweiz AG; 19 pages (including translation).

* cited by examiner

CONTROL SYSTEM FOR AN ELECTRICAL SWITCHING APPARATUS AND RELATED ELECTRICAL SWITCHING APPARATUS

The present invention relates to a control system for an electrical switching apparatus which is adapted to be installed in a medium voltage or high voltage electrical circuit.

For the purposes of the present invention, the term medium voltage is referred to applications with voltages higher than 1 kV AC and 1.5 kV DC up to tens of kV, e.g. up to 72 kV AC and 100 kV DC, and the term high voltage to applications in higher voltages.

An electrical switching apparatus is an electric apparatus comprising one or more switching devices.

As known, switching devices, typically circuit breakers, disconnectors, contactors or reclosers, are devices designed to allow the correct operation of specific parts of the electric circuits in which they are installed, and of the associated electric loads.

A switching device comprises one or more electric poles, or phases, each one comprising at least one movable contact and a corresponding fixed contact.

Actuating means are operatively connected to the movable contacts of the poles for causing an actuation of their contacts between an open position, where the movable contacts are separated from the corresponding fixed contacts, and a close position, where the movable contacts are coupled to the corresponding fixed contacts.

A control system can be operatively associated to the electrical switching apparatus. Such control system is adapted to execute a control logic for the electrical switching apparatus.

According to the present description, the control logic is a logic which describes the behavior of the switching apparatus. In practice, the control logic describes how, through a sequence of operations, the one or more switching devices and other associated components and/or elements of the switching apparatus can be operated, for example according to control algorithms, status of the apparatus, parameters, events, conditional changes, commands, et cetera.

According to non limiting examples, the control logic comprises the functions of driving the actuating means of the switching devices according to a control algorithm, providing the energy to such actuating means, interfacing sensors to acquire values related to a status or parameter of the apparatus, and implementing diagnostic and logic behaviors.

According to a first example, a known control system is used for one specific switching device. In particular, this control system is realized by a single module which is highly customized for the specific switching device. In this way, the customized module cannot be reused for other switching devices, or if application conditions of the switching device change with respect to those devised in the initial development phase, even after the release of the switching device on the market.

For example, the module is customized for a switching device having a specific number of poles; in practice, the control module is adapted, according to the execution of its control logic, only to drive the actuating means of the specific number of poles; hence, the module cannot be used for other switching devices having a different number of poles.

For example, the module has interfaces, such as communication interfaces, customized in view of the specific switching device and/or in view of specific applications or functions associated to such switching device. Hence, the module cannot be used if other interfaces are needed for operating with other switching devices, or with the same switching device but according to different applications or functions.

For example, the control logic executed by the module is customized for operating only according to predetermined parameters or logic functions, which are devised at the initial phase of the development of the switching device. Hence, if new parameters or logic functions are devised at a later stage, the customized module cannot be used anymore, unless the software of the module is changed, recompiled, and then the product is completely revalidated.

For example, the control logic executed by the module is customized for controlling a specific typology of switching device. In practice, if the switching device is a recloser, the control logic is customized only for implementing the operations required for a recloser. Hence, the customized module cannot be used for controlling other types of switching devices, such as a circuit breakers. Further, the electronic control unit of the customized module has to control, in parallel and real-time, the actuating means associated to all the poles of the switching device, as well as all the other logic or diagnostic functions associated to such poles.

This means a use of a complex electronic process unit, which is difficult to be developed and programmed.

According to a second example, a known control system comprises a single module which is highly customized for a specific number of specific switching devices. In this case, in addition to some of the above mentioned drawbacks, the customized module cannot be reused for a number of switching devices different with respect to the initially conceived number.

Further, the electronic control unit of the customized module has to control, in parallel and real-time, the actuating means associated to the poles of all the switching devices, as well as all the other logic or diagnostic functions associated to such switching devices.

This means even more a use of a complex electronic process unit, which is difficult to be developed and programmed.

In light of above, at the current state of the art, although known solutions perform in a rather satisfying way, there is still reason and desire for further improvements.

Such desire is fulfilled by a control system for an electrical switching apparatus adapted to be installed in a medium voltage or high voltage electrical circuit. The control system comprises:

at least a first module comprising first control means which are adapted to execute a first control logic, and a second module comprising second control means which are adapted to execute a second control logic; and at least one communication bus.

The first control means and the second control means are adapted to be operatively connected to the at least one communication bus, and to share values of variables associated to the first control logic and to the second control logic through the at least one communication bus.

Another aspect of the present invention is to provide an electrical switching apparatus which is adapted to be installed in a medium voltage or high voltage electrical circuit and comprising a control system as the control system defined by the annexed claims and disclosed in the following description.

Another aspect of the present invention is to provide a switchgear comprising a control system as the control system defined in the annexed claims and disclosed in the following description and/or at least one electrical switching apparatus as the electrical switching apparatus defined by the annexed claims and disclosed in the present description.

Further characteristics and advantages will become more apparent from the description of some preferred but not exclusive embodiments of the control system according to the present invention, illustrated only by way of non-limiting examples with the aid of the accompanying drawings, wherein.

Figure 1:
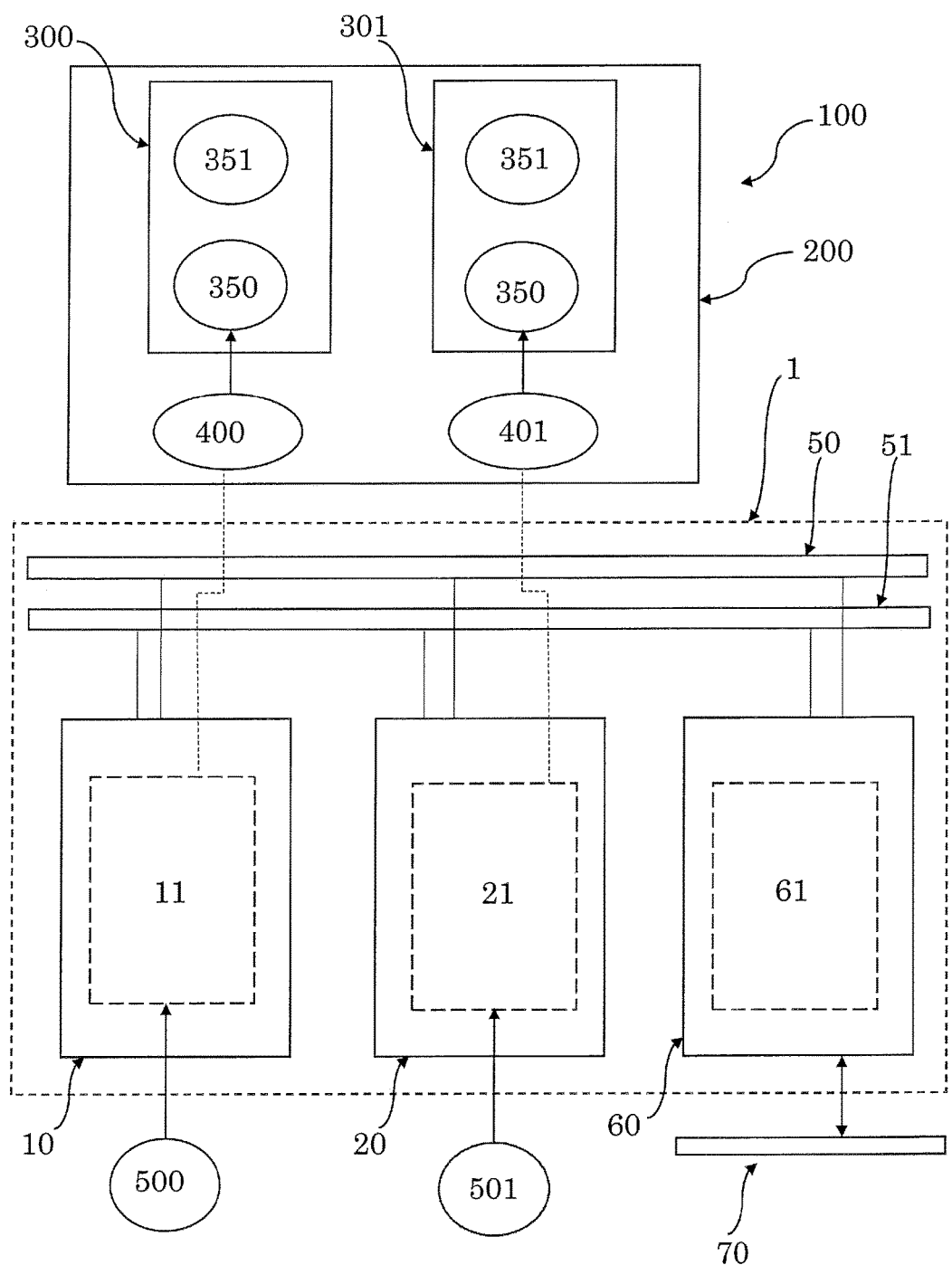
FIG. 1 is a schematic view, through blocks, of a first exemplary control system and related electrical switching apparatus according to the present invention.

It should be noted that in the detailed description that follows, identical or similar components, either from a structural and/or functional point of view, have the same reference numerals, regardless of whether they are shown in different embodiments or parts of the control system according to the present disclosure; it should also be noted that in order to clearly and concisely describe the present disclosure, the drawings may not necessarily be to scale and certain features of the disclosure are shown in somewhat schematic form.

Further, when the term "adapted" or "arranged" or "configured", is used herein while referring to any component as a whole, or to any part of a component, or to a whole combinations of components, or even to any part of a combination of components, it has to be understood that it means and encompasses correspondingly either the structure, and/or configuration and/or form and/or positioning of the related component or part thereof, or combinations of components or part thereof, such term refers to.

With reference to the attached figures, the present disclosure is related to a control system 1 for an electrical switching apparatus 100 which is adapted to be installed in a medium or high voltage electrical circuit.

The control system 1 comprises at least a first module 10 having first control means 11 which are adapted to execute a first control logic, and a second module 20 having second control means 21 which are adapted to execute a second control logic.

The control system 1 further comprises at least one communication bus 50, 51.

Advantageously, the first control means 11 and second control means 21 are adapted to be operatively connected with such at least one communication bus 50, 51, and to share values of variables associated to the first control logic and the second control logic through the communication bus 50, 51.

In this way, the first and second control logics are adapted to implement, through the sharing of values of variables on the communication bus 50, 51, an overall distributed control logic for the electrical switching apparatus 100.

The values shared by the first and second modules 10 and 20 through the at least one communication bus 50, 51 comprise at least:

values of output variables of the second control logic, wherein the first control means 11 of the first module 10 are adapted to use such values of the output variables of the second control logic as values of input variables of the first control logic; and/or values of output variables of the first control logic, wherein the second control means 21 of the second module 20 are adapted to use such values of the output variables of the first control logic as values of input variables of the second control logic.

For example, the shared values between the first and second control means 11 and 21 comprise values of Boolean variables. Such Boolean values are logical values, which for example describe a logic condition, status, change, opening, or closure, or interlock commands associated to the electrical switching apparatus 100 and/or the control system 1.

For example, the shared values between the first and second control means 11 and 21 comprise values of numerical, or floating, variables. Such numerical values can be for example sensed or measured values of parameters associated to the electrical switching apparatus 100 and/or the control system 1, or numerical values calculated by the control system 1.

Figure 2:
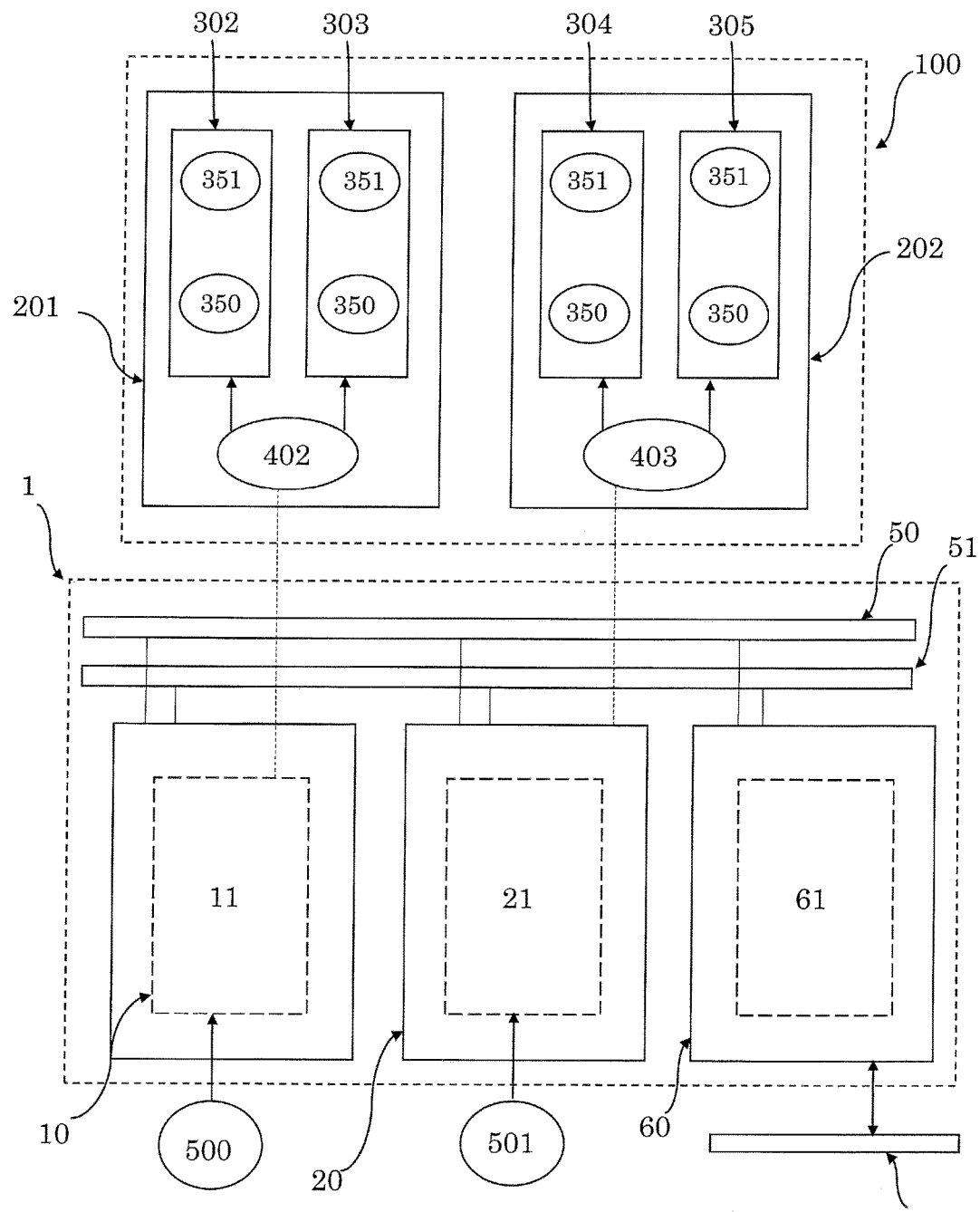
FIG. 2 is a schematic view, through blocks, of a second exemplary control system and related electrical switching apparatus according to the present invention.

According to the exemplary embodiments illustrated in FIGS. 1 and 2, the control system 1 of the present invention is adapted to control an electrical switching apparatus 100 comprising a plurality of electrical poles 300-305.

Each pole 300-305 comprises at least one movable contact 350 which can be actuated between a close position, where it is coupled to a corresponding fixed contact 351, and an open position where it is separated from the corresponding fixed contact 351.

In order to actuate the movable contacts 350, the electrical switching apparatus 100 comprises actuating means 400-403 operatively connected to the movable contacts 350.

For example, the electrical switching apparatus 100 comprises one or more switching devices 200, 201, 202; each of such switching devices 200, 201, 202 having one or more electrical poles 300, 301, 302, 303, 304, 305 and corresponding actuating means 400-403 for the movable contacts 350. According to the exemplary embodiment illustrated in FIG. 1, the electrical switching apparatus 100 comprises one switching device 200 with a plurality of poles 300, 301, wherein the control system 1 is adapted to control such switching device 200.

In particular, the switching device 200 illustrated in FIG. 1 comprises two poles 300 and 301, and actuating means 400 and 401 operatively connected to the movable contacts 350 of the two poles 300, 301. The control system 1 comprise two control modules 10 and 20 which are operatively associable to the pole 300 and the pole 301, respectively.

However, the switching device 200 can comprise more than two poles 300, 301; in this case, the control system 1 according to the present invention can comprise two or more control modules, as the modules 10 and 20, each one operatively associable to one corresponding pole, or to a plurality of poles of the switching device 200.

For example, the switching device 200 can comprise three poles, and the control system 1 can comprise three control modules, as the modules 10 and 20, each one operatively associable to a corresponding one of the three poles.

In this case, each of these three modules comprises its own control means for executing a control logic, and the three modules can be connected to the at least one communication bus 50, 51 for sharing values of variables associated to their control logics. In this way, an overall distributed logic is implemented for the three-polar switching device 200.

According to the exemplary embodiment illustrated in FIG. 2, the electrical switching apparatus 100 comprises a plurality of switching devices 201, 202, each one having one or more poles 302, 303, 303, 304, wherein the control system 100 is adapted to control such plurality of switching devices 201, 202.

In particular, the apparatus 100 illustrated in FIG. 1 comprises two switching devices 201 and 202, each one having two poles 302-303, 304-305. Actuating means 402 are operatively connected to the movable contacts 350 of the two poles 302, 303 of the switching device 200, and actuating means 403 are operatively connected to the movable contacts 350 of the two poles 304, 305 of the switching device 201. The control system 1 comprises the first module 10 which is operatively associable to the poles 302 and 303 of the switching device 201, and the second module 20 which is operatively associable to the poles 303, 304 of the switching device 202.

However, the electrical switching apparatus 100 can comprise more than two switching devices, each having one pole or more than two poles. In this case, the control system 1 according to the present invention can comprise more than two modules, as the control modules 10 and 20, each one operatively associable to the poles of a corresponding switching device.

For example, the electrical switching apparatus 100 can comprise four switching devices, and the control system 1 can comprise four control modules, as the modules 10 and 20, each one operatively associable to the poles of a corresponding switching device.

In this case, each of these four modules comprises its own control means for executing a control logic, and the four modules can be connected to the at least one communication bus 50, 51 for sharing values of variables associated to their control logics. In this way, an overall distributed logic is implemented for the apparatus 100 comprising four switching devices.

Preferably, the control system 1 according to the present invention is advantageously adapted to implement a distributed control functionality for the actuations of the electrical switching apparatus 100.

With reference to the exemplary embodiment illustrated in FIG. 1:
  the first control means 11 of the first module 10 are adapted to drive, according to the execution of the first control logic, the actuating means 400 for controlling the actuations of the movable contacts 350 of the pole 300 of the switching device 200; and
  the second control means 21 of the second module 20 are adapted to drive, according to the execution of the second control logic, the actuating means 401 for controlling the actuations of the movable contacts 350 of the pole 301.

With reference to the exemplary embodiment illustrated in FIG. 2:
  the first control means 11 of the first module 10 are adapted to drive, according to the execution of the first control logic, the actuating means 402 for controlling the actuations of the movable contacts 350 of the poles 302 and 303 of the switching device 201; and
  the second control means 21 of the second module 20 are adapted to drive, according to the execution of the second control logic, the actuating means 403 for controlling the actuations of the movable contacts 350 of the poles 304, 305 of the switching device 202.

Preferably, the driving by the first control means 11 and the second control means 21 of the respective actuating means 400-403 comprises providing to such actuating means 400-403 the energy required to perform the controlled actuation of the movable contacts 350.

Preferably, the first control means 11 and the second control means 21 are adapted to drive the actuation of the respective actuating means 400-403 in such a way to synchronize the controlled actuation of the movable contacts 350 to a waveform of an electrical signal associated to the electrical circuit into which the electrical switching apparatus 100 is installed.

Preferably, the control system 1 according to the present invention is advantageously adapted to implement a distributed and shared acquisition of outputs by sensors 500, 501; these sensed outputs are related to parameters associated to the electrical switching apparatus 100 and/or to the control system 1.

In particular, according to the execution of the first control logic, the first control means 11 of the first module 10 are adapted to:
  acquire from sensors 500 first outputs related to the electrical switching apparatus 100 and/or to the first module 10;
  obtain from the first outputs one or more values of variables associated to at least one of the first control logic and the second control logic; and share with the second control means 21, through the at least one communication bus 50, 51, such obtained one or more values.

Preferably, the first control means 11 are adapted to obtain, directly or indirectly from one or more of the first outputs, values which are used as values of input variables associated to the first control logic.

For example, the first outputs comprise values related to the movable contacts 350 of poles 300, 302, 303 and/or to the associated actuating means 400, 402, e.g. measurements of the position of the movable contacts 350 and/or the associated actuating means 400, 402.

The first control means 11 are adapted to use such values as values of input variables associated to the first control logic. In practice, such sensed values can be used to feed, as input feedback values, the algorithm control implemented according to the execution of the first control logic by the first control means 11.

According to the execution of the second control logic, the second control means 21 of the second module 20 are adapted to:
  acquire from sensors 501 second outputs related to the electrical switching apparatus 100 and/or to the second module 20;
  obtain from the second outputs one or more values of variables associated to at least one of the first control logic and the second control logic; and
  share with the first control means 11, through the at least one communication bus 50, 51, such obtained one or more values.

Preferably, the second control means 21 are adapted to obtain, directly or indirectly from one or more of the second outputs, values which are used as values of input variables associated to the second control logic.

For example, the second outputs comprise values related to the movable contacts 350 of poles 301, 304, 305 and/or to the associated actuating means 401, 403, e.g. measurements of the position of the movable contacts 350 and/or the associated actuating means 401, 403.

The second control means 21 are adapted to use such values as values of input variables associated to the second control logic. In practice, such sensed values can be used to feed, as input feedback values, the algorithm control implemented according to the execution of the second control logic by the second control means 21.

Advantageously, the shared data between the first control means 11 and the second control means 21, through the at least one communication bus 50, 51, comprise some of the values obtained from the first outputs and/or some of the values obtained from the second outputs.

For example, with reference to the exemplary embodiment illustrated in FIG. 1, the first control means 11 of the first module 10 can share the acquired sensed values related to the movable contacts 350 of the pole 300 and/or to the associated actuating means 400 with the second control means 21 of the second module 20.

The second control means 21 are adapted to receive these shared sensed data and to use them as values of input variables associated to the second control logic.

For example, while the second control logic is executed by the second control means 21, these shared sensed data are used for implementing interlock functionalities. In practice, the shared sensed data related to the movable contacts 350 of the pole 300 and/or to the associated actuating means 400 are used by the second control logic as values of input variables for detecting a status related to the pole 300, e.g. contacts 350, 351 in open position, close position, or a fault position, and to enable or block the actuation of the contacts 350 of the pole 301 according to the detected status.

In the same way, the second control means 21 of the second module 20 can share the acquired sensed values related to the movable contacts 350 of the pole 301 and/or to the associated actuating means 401 with the first control means 11 of the first module 10.

The first control means 11 are adapted to receive these shared sensed values and to use them as values of input variables associated to the first control logic.

For example, with reference to the exemplary embodiment illustrated in FIG. 2, the first control means 11 of the first module 10 can share the obtained sensed data related to the movable contacts 350 of the poles 302, 303 of the switching device 201 and/or to the associated actuating means 402 with the second control means 21 of the second module 20.

The second control means 21 are adapted to receive these shared sensed data and to use them as values of input variables associated to the second control logic.

For example, while the second control logic is executed by the second control means 21, these shared sensed data are used at least for detecting a status related to the pole 302, 303, e.g. contacts 350, 351 in open position, close position, or a fault position.

The second control means 21 of the second module 20 can share the obtained sensed data related to the movable contacts 350 of the poles 304, 305 of the switching device 202 and/or to the associated actuating means 403 with the first control means 11 of the first module 10. The first control means 11 are adapted to receive these shared sensed data and to use them as values of input variables associated to the first control logic.

According to another example, the first outputs received by the first control means 11 comprise a measured temperature value associated to one or more elements and/or components of the first module 10.

The first control means 11 are adapted to share, through the at least one communication bus 50, 51, this acquired temperature value with said second control means 21.

The second control means 21 are adapted to receive the shared measured temperature value and use it as a numerical value of an input variable associated to the second control logic.

In particular, the second control means 21, according to the execution of the second control logic, are adapted to compare the received measured temperature value with a predetermined threshold value and to block the possibility of actuation of the controlled movable contacts 350, if the measured temperature value exceeds the predetermined threshold value.

Further, the second control means 21 are adapted to output a logic value indicative of the temperature exceeding in the first module 10. Such outputted logic value is put by the second control means 21 on the at least one communication bus 50, 51 for being shared with the first control means 11, as a value of an input variable of the first control logic.

For example, according to the execution of the first control logic, the first control means 11 are adapted to block the possibility of actuation of the movable contacts 350, if the shared logic value is received.

Preferably, the control system 1 according to the present invention is advantageously adapted to implement a distributed and shared acquisition of electrical commands, such as commands related to actuations or operations of the electrical switching apparatus 100.

For example, according to the execution of the first control logic, the first control means 11 of the first module 10 are adapted to acquire not only commands related to the opening or closure actuations of the associated poles 300, 302-303, but also commands related to the opening or closure actuations of the poles 301, 304-305 associated to the second module 20.

The first control means 11 are adapted to share these received commands to the second control means 21, through the at least one communication bus 50, 51; in particular, the second control means 21 are adapted to use the received values of the commands as values of input variables associated to the second control logic.

In practice, the second control means 21, while executing the second control logic, are adapted to control the actuation of the movable contacts 350 of the associated poles 301, 304-305 according to the received commands.

The control system 1 according to the present invention can be advantageously adapted to implement distributed and shared monitoring and/or diagnostic functions related to the electrical switching apparatus 100 and/or to the control system 1.

Preferably:
the first control means 11, according to the execution of the first control logic, are adapted to detect a fault condition related to the first module 10 and/or to the electrical switching apparatus 100, and to generate a value, e.g. a Boolean logic value, indicative of such detected condition; and/or the second control means 21, according to the execution of the second control logic, are adapted to detect a fault condition related to the second module 20 and/or to the electrical switching apparatus 100, and to generate a value, e.g. a Boolean logic value, indicative of such detected condition.

Advantageously, the values shared between the first and second control means 11, 21 through the at least one communication bus 50, 51 comprise the values indicative of the detected faults. In practice, a fault value output by the first control means 11, as a value associated to an output variable of the first control logic, can be received and used by the second control means 21 as an input value associated to an input variable of the second control logic, in order to implement a monitoring and/or diagnostic functionality. The same applies when the second control means 21 output a fault value.

For example, the fault conditions detected by the first control means 11 and/or the second control means 21 comprise a failure associated to the software of the first module 10 and/or the second module 20, such as a software load failure.

For example, according to the execution of the first control logic, the first control means 11 are adapted to block the possibility of actuation of the movable contacts 350, if a shared logic value is received related to a software fault of the second module 20.

For example, the fault conditions detected by the first control means 11 comprise a failure related to an actuation of the movable contacts 350 of the associated poles 300, 302, 303 which can be detected by using the acquired sensed data related to the movable contacts 350 and/or to the respective actuating means 400, 402.

For example, the fault conditions detected by the second control means 21 comprise a failure related to an actuation of the movable contacts 350 of the associated poles 301, 304, 305, which can be detected by using the acquired sensed data related to the movable contacts 350 and/or to the respective actuating means 401, 403.

Preferably, the first module 10, according to the execution of the first control logic, is adapted to output an alarm signal related to a received fault value shared by the second module 20 through the at least one communication bus 50, 51.

Preferably, the modules 10, 20 of the control system 1 according to the present invention are adapted to receive a configuration file 15 and use it for configuring their respective control logics. In practice, the configuration file 15 defines a specific control logic to be executed by the control means 11, 21 of the respective module 10, 20.

Figure 3:
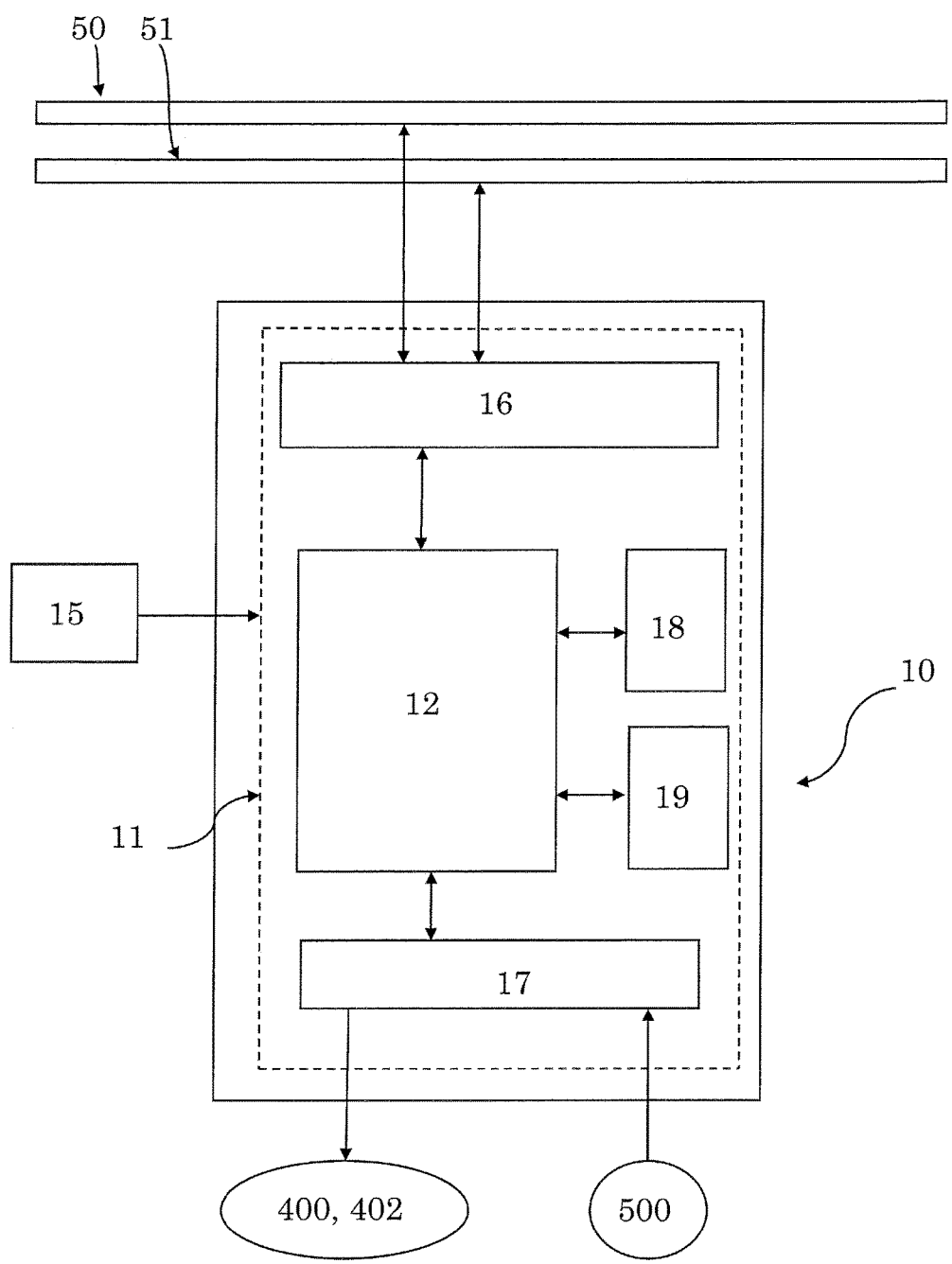
FIG. 3 is a schematic view, through blocks, of a control module which can be used in a control system according to the present invention.

The structure of the control modules 10, 20 used in the control system 1 according to the present invention is further disclosed, in particular by making reference for sake of simplicity only to the exemplary structure of the first control module 10 illustrated in FIG. 3.

Even if FIG. 3 illustrates the exemplary structure of only the first module 10, such structure corresponds to an exemplary structure which can be used also in the second module 20, or in further additional control modules that the control system 1 can comprise according to its specific applications.

According to the exemplary embodiment illustrated in FIG. 3, the first control means 11 comprise at least an electronic processing unit 12 adapted to carry out instructions of a program; such instructions being such that to cause an execution, when carried out by the electronic processing unit 12, of the first control logic.

In particular, the first control means 11 are adapted to receive the configuration file 15 and to use it for obtaining the program to be carried out by the processing unit 12, in order to execute a control logic according to the configuration file 15.

Preferably, the first control means 11 further comprise at least one circuitry 17 which is adapted to be driven, according to the execution of the first logic, by the electronic processing unit 12 in order to output control signals for the actuating means 400, 402 of the associated poles 300, 302, 303.

Such at least one circuitry 17 is further adapted to interface, according to the execution of the first logic, the sensors 500 in order to receive their outputs related to the electrical switching apparatus 100, in particular to the poles 300, 302, 303 and/or to the first module 10.

Preferably, the first control means 11 further comprise at least one of a binary input circuit 18 and a binary output circuit 19.

The binary input circuit 18 illustrated in FIG. 3 is adapted to receive command signals related at least to the opening or closure actuations of the poles 300, 302-303 associated to the first module 10; for example, the binary input circuit 18 can be adapted to receive also command signals related to the opening or closure actuations of the poles 301, 304-305 associated to the second module 20. In this way, such commands became available to the first control means 11 for being shared with the second control means 21 of the second module 20 through the at least one communication bus 50, 51.

The binary output circuit 19 illustrated in FIG. 3 is for example adapted to output signals or alarms related to a fault condition of the first module 10 and/or the poles 300, 302-303. Preferably, the binary output circuit 19 can be adapted to output also signals or alarms related to a fault condition of the second module 20 and/or the poles 301, 304-305, which are available from the second control means 21 to the first control means 11 by means of the at least one communication bus 50, 51.

The exemplary control means 11 illustrated in FIG. 3 comprise a further electronic processing unit 16 which is adapted at least to control the communication of the first control means 11 over the at least one communication bus 50, 51.

In particular, the electronic processing unit 16 is adapted at least to receive, through the at least one communication bus 50, 51, the values shared by the second control means 21 of the second module 20; in this way, such received values became available to the processing unit 12 for running the program which carries out the first control logic.

The electronic processing unit 16 is further adapted to put values associated to output variables of the first control logic on the at least one communication bus 50, 51, such as values generated in output by the electronic processing unit 12 or data acquired from the sensors 500.

According to the exemplary embodiments illustrated in the attached figures, the at least one communication bus 50, 51 of the control system 1 comprises at least a first communication bus 50 and a second communication bus 50. The control system 1 is adapted to:
  check the availability of the first communication bus 50 for sharing values of variables between the first and second control means 11 and 21;
  use the second communication bus 51 for service software operations, e.g. software uploads, related to the first and second control means 11, 21, while the first communication bus 50 is available; and
  switch the sharing of the values of variables between the first and second control means 11, 21 on the second communication bus 51, if the first communication bus 50 is not available for such sharing.

For example, the electronic processing unit 16 of the first control means 11 is adapted to carry out the above disclosed control on the first and second communication buses 50, 51.

According to the exemplary embodiments illustrated in FIGS. 1 and 2, the control system 1 further comprises at least one communication module 60.

The communication module 60 is adapted to be operatively connected with the at least one communication bus 50, 51 of the control system 1. In particular, the communication module 60 is adapted to put in operative communication such at least one communication bus 50, 51 with at least one further communication bus 70, e.g. a bus 70 external to the control system 1, such as a bus 70 implementing a MODBUS or CAN bus communication protocol.

Preferably, the communication module 60 is adapted to output a synchronization signal, and to send such synchronization signal to the first control means 11 of the first module 10 and to the second control means 21 of the second module 20, e.g. through the at least one communication bus 50, 51 of the control system 1.

In this case, all the events generated within the control modules 10, 20 of the control system 1 are time stamped with the synchronization signal.

For example, the communication module 60 is adapted to acquire the synchronization signal through the communication bus 70 or through an its own GPS port.

Preferably, the communication module 70 is adapted to:
  acquire outputs from sensors 700, such as for example sensed values related to the electrical circuit into which the electrical switching apparatus 100 is installed;
  use the acquired outputs to detect at least one fault condition;
  generate values, such as for example Boolean logic values, related to the detection of the fault condition; and
  share, through the at least one communication bus 50, 51, the generated values related to the detection of the fault condition with the first control means 11 of the first module 10 and the second control means 21 of the second module 20.

The first control means 11 and the second control means 21 are adapted to receive and use such shared values generated by the communication module 60 as values of input variables associated to the first control logic and to the second control logic, respectively.

For example, the shared values generated by the communication module 60 are adapted to be used by the first control means 11 and by the second control logic 21 for triggering, according to the execution of the respective first control logic and second control logic, an actuation of the controlled movable contacts 350, or for blocking a possibility of actuation of such contacts 350.

Figure 4:
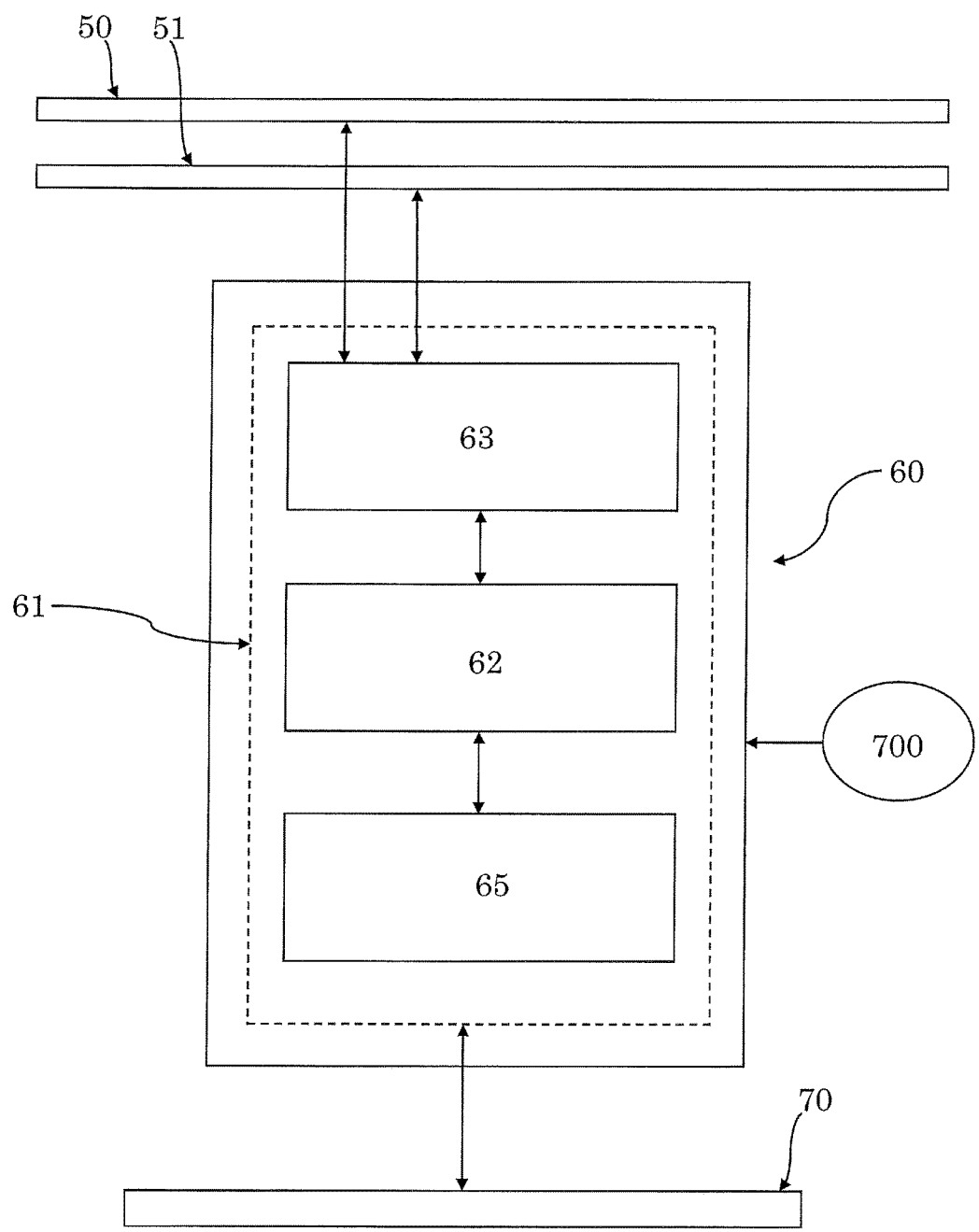
FIG. 4 is a schematic view, through blocks, of a communication module which can be used in a control system according to the present invention.

According to the exemplary embodiment illustrated in FIG. 4, the communication module 60 comprises control means 61 which are adapted to execute a control logic implementing the behavior of the communication module 60.

For example, the control means 61 comprise an electronic processing unit 62 which is adapted to carry out a program in order to execute the control logic of the communication module 60.

The exemplary control means 61 illustrated in FIG. 4 comprises a further electronic processing unit 63 which is adapted at least to control the communication of the control means 61 with the at least one communication bus 50, 51 and with the further bus 70.

In particular, the electronic processing unit 63 is adapted at least to put values or data, such as for example values of output variables of its control logic or received from the further bus 70 or sensors 700, on the at least one communication bus 50, 51. In this way, this values or data can be shared with the first control means 11 of the first module 10 and/or the second control means 21 of the second module 20.

Preferably, the electronic processing unit 63 is further adapted to receive, through the at least one communication bus 50, 51, values shared by the first control means 11 and/or second control means 21 of the second module 21, and to use them as values associated to input values of the control logic of the communication module 60, or to put them on the further bus 70.

Preferably, the control means 11 further comprises at least one circuitry 65 which is adapted to interface, according to the execution of the control logic of the communication module 60, sensors 700 in order to receive outputs by this sensors 700, such as data or values related to the electrical circuit into which the electrical switching apparatus 100 is installed.

In practice, it has been seen how the control system 1 according to the present invention allows achieving the intended object offering some improvements over known solutions.

In particular, the control system 1 allows to achieve an overall distributed control logic for the electrical switching apparatus 100; in practice, such overall logic is distributed among a plurality of control modules 10, 20 whose control logics can share values of associated variables through the at least one communication bus 50, 51.

The distributed overall control logic is configurable according to different electrical switching apparatuses 100, or according to different conditions of an electrical switching apparatus 100 with respect to those devised in an initial project phase.

For example, the distributed control logic of the control system 1 is configurable to electrical switching apparatuses 100 comprising different numbers of electrical poles.

With reference to the exemplary electrical switching apparatus 100 illustrated in FIG. 1, the distributed control logic of the control system 1 associated to the switching device 200 can be configured according to the number of poles of the switching device 200.

For example, the overall control logic of the system 1 illustrated in FIG. 1, distributed between the first and second modules 10, 20, is adapted to control the illustrated two-polar switching device 200. If a tri-polar switching device 200 is instead used, the control system 1 can be reconfigured by providing a further control module, as the first and second modules 10, 20, which is operatively associated to a corresponding pole of the tri-polar switching device 200 and which is put in communication with the at least one bus 50, 51.

The added module can share, through the at least one communication bus 50, 51, values of variables associated to its control logic with the first and second control logics of the first and second modules 10, 20, as well as receive shared values of variables associated to the first and second control logics. In practice, the overall control logic of the control system 1 illustrated in FIG. 1 is expanded for controlling a tri-polar switching device 200.

In order to return to a control system 1 for controlling a two-polar switching device 200, the added control module can be disconnected from the at least one communication bus 50, 51.

With reference to the exemplary electrical switching apparatus 100 illustrated in FIG. 2, the distributed control logic of the control system 1 associated to the plurality of switching device 200, 201 can be configured according to the number of switching devices 200, 201

For example, the overall control logic of the system 1 illustrated in FIG. 2, distributed between the first and second modules 10, 20, is adapted to control the illustrated switching devices 200, 201. If one switching device is added to the electrical apparatus 100, the control system 1 can be reconfigured by providing a further control module, as the first and second modules 10, 20, which is operatively associated to the added switching device and which is put in communication with the at least one bus 50, 51.

The added module can share, through the at least one communication bus 50, 51, values of variables associated to its control logic with the first and second control logics of the first and second modules 10, 20, as well as receive shared values of variables associated to the first and second control logics.

In practice, the overall control logic of the control system 1 illustrated in FIG. 3 is expanded for controlling three switching devices.

In order to return to a control system 1 for controlling a two witching devices 200, 201 the added control module can be disconnected from the at least one communication bus 50, 51.

Having an overall control logic for the electrical switching apparatus 100 distributed between a plurality of modules 10, 20 provides the advantage of having the control means 11, 21 of such modules 10, 20 operatively associated to only one or some parts of the overall electrical switching apparatus 100.

For example, the electronic processing units in the control means 11, 21 of the first and second modules 10, 20 illustrated in FIG. 1 are adapted to control the actuating means 400 of the pole 300 and the actuating means 401 of the pole 301, respectively, instead of having a single electronic processing unit that has to control, in parallel and real time, both the poles 300 and 301.

For example, the electronic processing units in the control means 11, 21 of the first and second modules 10, 20 illustrated in FIG. 2 are adapted to control actuations of the first switching device 200 and the second switching device 201, respectively, instead of having a single electronic processing unit that has to control, in parallel and real time, both the switching devices 200 and 201.

This means that the electronic processing units in the control means 11, 21 can be less complex and can be easily developed and programmed.

Preferably, the control logic executed by the control means 11, 21 of each module 10, 20 of the control system 1 is configurable through the configuration file 15; in practice, by changing the configuration file 15 the implemented control logic of the modules 10, 20 is changed accordingly. In this way, the control logic of the modules 10, 20 can be easily configured according to different types of associated electrical switching apparatuses 100 and/or according to changings of parameters or logic functions associated to the electrical switching apparatus 100.

Hence, the control system 1 can be used for different electrical switching apparatuses 100 and if new parameters of logic functions are devised for the switching apparatuses 100, even after the release of the switching apparatuses 100.

For example, the control modules 10, 20 of a control system 1 initially used for controlling an electrical switching apparatus 100 comprising one or more circuit breakers can be reused for controlling an electrical switching apparatus comprising one or more reclosers, or other types of switching devices. In practice, the configuration file 15 for implementing a control logic adapted to cause, through its execution, the control of circuit breakers is changed with a configuration file 15 for implementing a control logic adapted to cause, through its execution, the control of reclosers.

According to the exemplary embodiments illustrated in the attached figures, the control system 1 further comprises at least one communication module 60.

Providing one or more communication modules 60 connected to the at least one communication bus 50, 51 of the control system 1 means adding communication interfaces for the modules 10, 20 also connected to the communication bus 50, 51.

In this way, the overall interface capability of the control system 1 is also configurable according to different electrical switching apparatuses 100 and/or difference applications or functions associated to such apparatuses 100.

The control system 1 thus conceived and related electrical switching apparatus 100 are also susceptible of modifications and variations, all of which are within the scope of the inventive concept as defined in particular by the appended claims.

For example, even if in the embodiment illustrated in FIG. 2 the control system 1 comprises one module 10 operatively associated to the switching device 201 and one module 20 operatively associated to the switching device 202, the control system 1 can comprise a number of modules, as the modules 10, 20, corresponding to the number of poles provided by the switching devices. In practice, according to such example, each of the modules of the control system 1 is operatively associated to one corresponding pole of the switching devices.

In order to execute at least the above disclosed tasks, the control means 11, 21 of the modules 10, 20 may comprise as electronic processing units: microprocessors, microcontrollers, microcomputers, minicomputers, digital signal processors (DSPs), optical computers, complex instruction set computers, application specific integrated circuits, a reduced instruction set computers, analog computers, digital computers, solid-state computers, single-board computers, or a combination of any of these.

Even if in the exemplary embodiment illustrated in FIG. 3 the electronic processing units 12, 16 and the circuitries 17, 18, 19 are illustrated as separated elements operatively connected to each other, all these elements or a part thereof can be integrated in a single electronic element.

Even if in the exemplary embodiment illustrated in FIG. 4 the electronic processing units 62, 63 and the circuitry 65 are illustrated as separated elements operatively connected to each other, all these elements of a part thereof can be integrated in a single electronic element.

In practice, all parts/components can be replaced with other technically equivalent elements; in practice, the type of materials, and the dimensions, can be any according to needs and to the state of the art.

The invention claimed is:

1. A control system for an electrical switching apparatus adapted to be installed in a medium voltage or high voltage electrical circuit, comprising:

at least a first module comprising first control means which are adapted to execute a first control logic, and a second module comprising second control means which are adapted to execute a second control logic; and at least one communication bus;

wherein said first control means and said second control means are adapted to be operatively connected to said at least one communication bus, and to share values of variables associated to said first control logic and to said second control logic through said at least one communication bus;

wherein said electrical switching apparatus comprises at least one or more first poles and one or more second poles, and wherein said first module is operatively associable to said one or more first poles and said second module is operatively associable to said one or more second poles; and wherein:

said one or more first poles comprise first movable contacts and said one or more second poles comprise second movable contacts;

said electrical switching apparatus comprises first actuating means operatively connected to said first movable contacts and second actuating means operatively connected to said second movable contacts;

said first control means are adapted to drive said first actuating means for controlling an actuation of said first movable contacts; and said second control means are adapted to drive said second actuating means for controlling an actuation of said second movable contacts.

2. The control system according to claim 1, wherein said first outputs comprise outputs related to the first actuating means and/or to said first movable contacts, and wherein said first control means are adapted to obtain from said outputs values of input variables associated to the first control logic.

3. The control system according to claim 2, wherein:

said first control means are adapted to detect a fault condition related to the first module and/or the electrical switching apparatus and to generate a value indicative of said detected condition; and said shared values between the first and second control means comprise said value indicative of the detected fault condition.

4. The control system according to claim 1, wherein:

said first control means are adapted to detect a fault condition related to the first module and/or the electrical switching apparatus and to generate a value indicative of said detected condition; and said shared values between the first and second control means comprise said value indicative of the detected fault condition.

5. An electrical switching apparatus adapted to be installed in a medium voltage or high voltage electrical circuit, characterized in that it comprises a control system according to claim 1.

6. A switchgear characterized in that it comprises a control system according to claim 1.

7. The control system according to claim 1, wherein said first control means are adapted to receive a configuration file and use said configuration file for configuring said first control logic.

8. A control system for an electrical switching apparatus adapted to be installed in a medium voltage or high voltage electrical circuit, comprising:

at least a first module comprising first control means which are adapted to execute a first control logic, and a second module comprising second control means which are adapted to execute a second control logic; and at least one communication bus;

wherein said first control means and said second control means are adapted to be operatively connected to said at least one communication bus, and to share values of variables associated to said first control logic and to said second control logic through said at least one communication bus;

wherein:

said first control means are adapted to detect a fault condition related to the first module and/or the electrical switching apparatus and to generate a value indicative of said detected condition; and said shared values between the first and second control means comprise said value indicative of the detected fault condition; and wherein said second control means are adapted to output an alarm signal related to said shared value indicative of the detected fault condition.

9. The control system according to claim 8, wherein said fault condition comprises a failure associated to software of the first module.

10. A control system for an electrical switching apparatus adapted to be installed in a medium voltage or high voltage electrical circuit, comprising:

at least a first module comprising first control means which are adapted to execute a first control logic, and a second module comprising second control means which are adapted to execute a second control logic; and at least one communication bus;

wherein said first control means and said second control means are adapted to be operatively connected to said at least one communication bus, and to share values of variables associated to said first control logic and to said second control logic through said at least one communication bus;

wherein:

said first control means are adapted to detect a fault condition related to the first module and/or the electrical switching apparatus and to generate a value indicative of said detected condition; and said shared values between the first and second control means comprise said value indicative of the detected fault condition; and wherein said fault condition comprises a failure associated to software of the first module.

11. A control system for an electrical switching apparatus adapted to be installed in a medium voltage or high voltage electrical circuit, comprising:

at least a first module comprising first control means which are adapted to execute a first control logic, and a second module comprising second control means which are adapted to execute a second control logic; and at least one communication bus;

wherein said first control means and said second control means are adapted to be operatively connected to said at least one communication bus, and to share values of variables associated to said first control logic and to said second control logic through said at least one communication bus;

wherein said electrical switching apparatus comprises at least one or more first poles and one or more second poles, and wherein said first module is operatively associable to said one or more first poles and said second module is operatively associable to said one or more second poles; and wherein:

said first control means are adapted to acquire a command related to an actuation of said one or more second poles; and said shared values between the first and second control means comprise said command.

12. The control system according to claim 11, wherein said first control means are adapted to receive a configuration file and use said configuration file for configuring said first control logic.

13. A control system for an electrical switching apparatus adapted to be installed in a medium voltage or high voltage electrical circuit, comprising:
- at least a first module comprising first control means which are adapted to execute a first control logic, and a second module comprising second control means which are adapted to execute a second control logic; and
- at least one communication bus;
  wherein said first control means and said second control means are adapted to be operatively connected to said at least one communication bus, and to share values of variables associated to said first control logic and to said second control logic through said at least one communication bus; and
  wherein said at least one communication bus comprises a first communication bus and a second communication bus, and wherein said control system is adapted to:
- check the availability of the first communication bus for sharing said values of variables associated to said first control logic and to said second control logic;
- use the second communication bus for service software operations related to said first and second control means, while the first communication is available for said sharing; and
- switch the sharing of said values of variables associated to said first control logic and to said second control logic on the second communication bus, if the first communication bus is not available for said sharing.

14. A control system for an electrical switching apparatus adapted to be installed in a medium voltage or high voltage electrical circuit, comprising:
- at least a first module comprising first control means which are adapted to execute a first control logic, and a second module comprising second control means which are adapted to execute a second control logic; and
- at least one communication bus;
  wherein said first control means and said second control means are adapted to be operatively connected to said at least one communication bus, and to share values of variables associated to said first control logic and to said second control logic through said at least one communication bus; and
  wherein said control system further comprises at least one communication module which is adapted to be operatively connected with said at least one communication bus, and which is adapted to put in operative communication said at least one communication bus with at least one further communication bus.

15. The control system according to claim 14, wherein said communication module is adapted to:
- acquire second outputs from second sensors;
- use said second outputs to detect at least one fault condition;
- generate at least one value related to the detection of said fault condition;
- share said at least one generated value at least with said first control means, through said at least one communication bus;
  wherein said first control means are adapted to use said at least one generated value as a value of an input variable associated to said first control logic.

16. The control system according to claim 14, wherein said communication module is adapted to output a synchronization signal.

17. The control system according to claim 15, wherein said communication module is adapted to output a synchronization signal.

18. A control system for an electrical switching apparatus adapted to be installed in a medium voltage or high voltage electrical circuit, comprising:
- at least a first module comprising first control means which are adapted to execute a first control logic, and a second module comprising second control means which are adapted to execute a second control logic; and
- at least one communication bus;
  wherein said first control means and said second control means are adapted to be operatively connected to said at least one communication bus, and to share values of variables associated to said first control logic and to said second control logic through said at least one communication bus;
  wherein said values comprise values of output variables of the second control logic, and wherein said first control means are adapted to use said values of the output variables of the second control logic as values of input variables of the first control logic; and
  wherein:
- said first control means are adapted to acquire first outputs from first sensors, said first outputs being related to the electrical switching apparatus and/or to the first module; and
- said first control means are adapted to obtain from said first outputs one or more values of variables associated to at least one of said first control logic and said second control logic; and
- said shared values between the first and second control means comprise said one or more values.

19. A control system for an electrical switching apparatus adapted to be installed in a medium voltage or high voltage electrical circuit, comprising:
- at least a first module comprising first control means which are adapted to execute a first control logic, and a second module comprising second control means which are adapted to execute a second control logic; and
- at least one communication bus;
  wherein said first control means and said second control means are adapted to be operatively connected to said at least one communication bus, and to share values of variables associated to said first control logic and to said second control logic through said at least one communication bus;
  wherein said values comprise values of output variables of the second control logic, and wherein said first control means are adapted to use said values of the output variables of the second control logic as values of input variables of the first control logic; and
  wherein said electrical switching apparatus comprises at least one or more first poles and one or more second poles and wherein said first module is operatively associable to said one or more first poles and said second module is operatively associable to said one or more second poles.

20. A control system for an electrical switching apparatus adapted to be installed in a medium voltage or high voltage electrical circuit, comprising:

at least a first module comprising first control means which are adapted to execute a first control logic, and a second module comprising second control means which are adapted to execute a second control logic; and at least one communication bus;

wherein said first control means and said second control means are adapted to be operatively connected to said at least one communication bus, and to share values of variables associated to said first control logic and to said second control logic through said at least one communication bus;

wherein:

said first control means are adapted to acquire first outputs from first sensors, said first outputs being related to the electrical switching apparatus and/or to the first module; and said first control means are adapted to obtain from said first outputs one or more values of variables associated to at least one of said first control logic and said second control logic; and said shared values between the first and second control means comprise said one or more values; and wherein said electrical switching apparatus comprises at least one or more first poles and one or more second poles and wherein said first module is operatively associable to said one or more first poles and said second module is operatively associable to said one or more second poles.

* * * * *